US009201834B2

(12) United States Patent
Ken et al.

(10) Patent No.: US 9,201,834 B2
(45) Date of Patent: Dec. 1, 2015

(54) RECONFIGURABLE HIGH SPEED MEMORY CHIP MODULE AND ELECTRONIC DEVICE WITH A RECONFIGURABLE HIGH SPEED MEMORY CHIP MODULE

(71) Applicant: Etron Technology, Inc., Hsinchu (TW)

(72) Inventors: Weng-Dah Ken, Hsinchu (TW); Chao-Chun Lu, Taipei (TW); Jan-Mye Sung, Taoyuan County (TW)

(73) Assignee: Etron Technology, Inc., Hsinchu (TW)

( * ) Notice: Subject to any disclaimer, the term of this patent is extended or adjusted under 35 U.S.C. 154(b) by 415 days.

(21) Appl. No.: 13/666,993

(22) Filed: Nov. 2, 2012

(65) Prior Publication Data

US 2013/0091312 A1 Apr. 11, 2013

Related U.S. Application Data

(63) Continuation-in-part of application No. 13/649,131, filed on Oct. 11, 2012.

(60) Provisional application No. 61/555,468, filed on Nov. 3, 2011, provisional application No. 61/546,039, filed on Oct. 11, 2011.

(51) Int. Cl.
*G06F 13/40* (2006.01)
*G06F 13/42* (2006.01)

(52) U.S. Cl.
CPC ............ *G06F 13/42* (2013.01); *G06F 13/4018* (2013.01); *H01L 2924/3025* (2013.01)

(58) Field of Classification Search
CPC .................................................. G06F 13/4018

USPC ...................... 710/104–110, 52–53, 305–308
See application file for complete search history.

(56) References Cited

U.S. PATENT DOCUMENTS

| | | | |
|---|---|---|---|
| 6,317,377 B1 | 11/2001 | Kobayashi | |
| 7,013,359 B1* | 3/2006 | Li | 710/305 |
| 7,206,876 B2* | 4/2007 | Jang | 710/66 |
| 7,245,239 B2 | 7/2007 | Wallner | |
| 7,385,281 B2 | 6/2008 | Nishio | |
| 7,546,497 B2* | 6/2009 | Jang | 714/718 |
| 7,680,966 B1* | 3/2010 | Falik et al. | 710/45 |
| 7,810,017 B2* | 10/2010 | Radke | 714/769 |
| 7,903,685 B2* | 3/2011 | Eshraghian | 370/466 |
| 8,036,052 B2* | 10/2011 | Lee et al. | 365/201 |
| 8,473,653 B2* | 6/2013 | Kondo et al. | 710/71 |
| 8,803,545 B2* | 8/2014 | Yoko et al. | 324/762.06 |
| 2004/0246801 A1* | 12/2004 | Lee et al. | 365/221 |
| 2004/0260864 A1* | 12/2004 | Lee et al. | 711/101 |
| 2007/0005831 A1* | 1/2007 | Gregorius | 710/52 |
| 2009/0024790 A1 | 1/2009 | Rajan | |
| 2009/0039492 A1 | 2/2009 | Kang | |
| 2010/0235554 A1* | 9/2010 | Chang et al. | 710/104 |

* cited by examiner

*Primary Examiner* — Raymond Phan
(74) *Attorney, Agent, or Firm* — Winston Hsu; Scott Margo

(57) ABSTRACT

A reconfigurable high speed memory chip module includes a type of memory cell array group, a first transmission bus, and a logic unit. The type memory cell array group includes multiple memory cell array integrated circuits (ICs). The first transmission bus coupled to the type memory cell array group has a first programmable transmitting or receiving data rate, a first programmable transmitting or receiving signal swing, a first programmable bus width, and a combination thereof. The logic unit is coupled to the first transmission bus for accessing the type memory cell array group through the first transmission bus.

23 Claims, 16 Drawing Sheets

RECONFIGURABLE HIGH SPEED MEMORY CHIP MODULE AND ELECTRONIC DEVICE WITH A RECONFIGURABLE HIGH SPEED MEMORY CHIP MODULE

CROSS REFERENCE TO RELATED APPLICATIONS

This application claims the benefit of U.S. Provisional Application No. 61/555,468, filed on Nov. 3, 2011 and entitled "Reconfigurable system-in-package memory platform," and is a continuation-in-part application of U.S. application Ser. No. 13/649,131, filed on Oct. 11, 2012 and entitled "HIGH SPEED MEMORY CHIP MODULE AND ELECTRONICS SYSTEM DEVICE WITH A HIGH SPEED MEMORY CHIP MODULE," which claims the benefit of U.S. Provisional Application No. 61/546,039, filed on Oct. 11, 2011 and entitled "High Speed Memory Platform." The disclosures of the prior applications are incorporated herein by reference herein in their entirety.

BACKGROUND OF THE INVENTION

1. Field of the Invention

The present invention relates to a high speed memory chip module and a electronics system device with a high speed memory chip module, and particularly to a high speed memory chip module and an electronics system device with a high speed memory chip module that have lower power consumption, lower effective greenhouse gas emission rate, higher data transmission efficiency, enhanced electromagnetic interference (EMI) shielding effect, better heat dissipation capability, and an external noise isolation function.

2. Description of the Prior Art

Generally speaking, memories are usually designed as standard memory module or chip which are independent from logic units based on certain industry standard (e.g. Joint Electronic Device Engineering Council, JEDEC is the exemplary one). That is to say, memories are designed typically as standard memory module or chip for various logic units based on certain industry standard, but not for predetermined logic units. Those common standards, including its well known function or definition about the bus width, signal levels and operating frequency limitations, dictated the memory bus width, the given signal swing and transmission data rate which resulted in lower manufacturability, less flexibility and higher system migration cost among different process technology generations and different applications.

In the prior art, because memory semiconductor process generations are typically more advanced and different from logic unit semiconductor process generations. That is to say, a chip or module memory system, integrating discrete memories with the advanced semiconductor process generations, may face poorer heat dissipation, higher power consumption and bad noise interference, so the chip or module memory system with integrating memories and logic units still suffers from much manufacturing difficulty.

SUMMARY OF THE INVENTION

An embodiment provides a reconfigurable high speed memory chip module. The reconfigurable high speed memory chip module includes a type of memory cell array group, a first transmission bus, and a logic unit. The type of memory cell array group includes multiple memory cell array integrated circuits (ICs). The first transmission bus coupled to the type of memory cell array group has a first programmable transmitting data rate, a first programmable receiving data rate, a first programmable transmitting signal swing, a first programmable receiving signal swing, a first programmable bus width, and a combination thereof. The logic unit is coupled to the first transmission bus for accessing the type of memory cell array group through the first transmission bus.

Another embodiment provides an electronics system device with a high speed memory chip module. The electronics system device includes an application specific integrated circuit (ASIC) processor, a type of memory cell array group, a first transmission bus, and a logic unit. The type of memory cell array group includes multiple memory cell array ICs. The first transmission bus coupled to the type of memory cell array group has a first programmable transmitting or receiving data rate, a first programmable transmitting or receiving signal corresponding to firmware or software included in the ASIC processor. The logic unit is coupled to the first transmission bus for accessing the type of memory cell array group through the first transmission bus.

The present invention provides a high speed memory chip module and an electronics system device with a high speed memory chip module. The high speed memory chip module and the electronics system device have advantages at least as follows: firstly, because this invention comprises a first transmission bus has a first programmable transmitting or receiving data rate, a first programmable transmitting or receiving signal swing, a first programmable bus width including a first programmable data width, a first programmable address width, and a combination thereof, and a second transmission bus has a second programmable transmitting or receiving data rate, a second programmable transmitting or receiving signal swing, a second programmable bus width including a second programmable data width, a second programmable address width, and a combination thereof, as a result, the present invention has lower power consumption given the performance requirements, higher transmission efficiency given the power limitations, lower cost, higher manufacturability, less technology migration effort, wider application ranges and higher overall performance while operating. Those embodiments can be applied to various ASIC processors (or various SOC processors); and secondly, because the present invention can utilize a plurality of TSVs exist within a non-active circuit region of each memory cell array IC or a plurality of TSVs exist within a non-active circuit region of a logic unit to form a metal fence, comparing to the prior art, the present invention has better EMI shielding effect, better heat dissipation capability, and an better external noise isolation function based on the magnetic-electronic theory available today.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
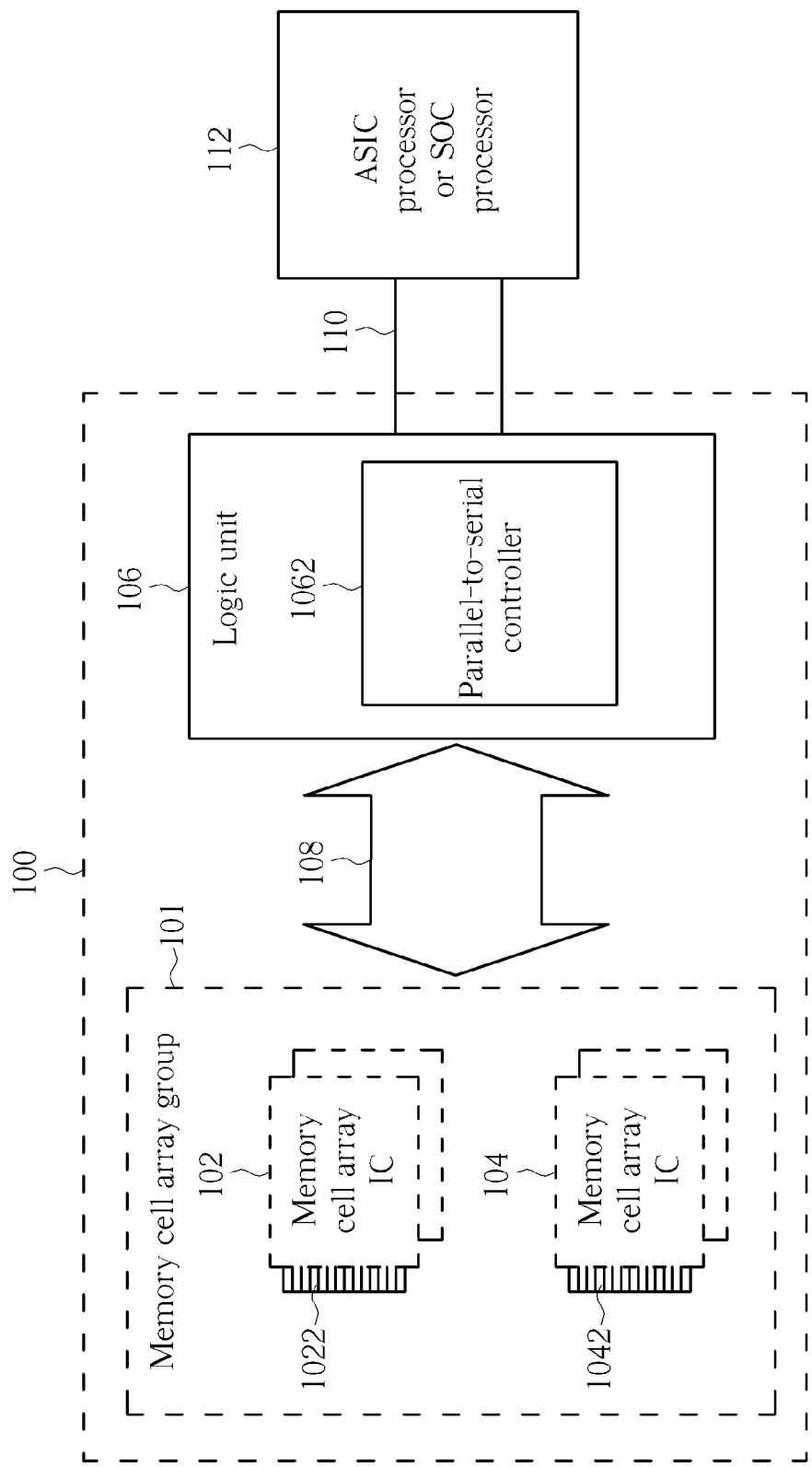
FIG. 1 is a diagram illustrating a high speed memory chip module according to an embodiment.

Please refer to FIG. 1. FIG. 1 is a diagram illustrating a high speed memory chip module 100 according to an embodiment. The high speed memory chip module 100 includes a type of memory cell array group 101, a first transmission bus 108, and a logic unit 106, where the type of memory cell array group 101 includes a memory cell array integrated circuit (IC) 102 which is a Dynamic Random Access Memory (DRAM) IC and a memory cell array IC 104 which is a flash or non-volatile memory (NVM) IC (e.g. a phase-change random access memory (PCRAM), a resistive random access memory (RRAM), an electrically-erasable programmable read-only memory (EEPROM), an erasable programmable read-only memory (EPROM), a magnetoresistive random access memory (MRAM), and so on). But, the present invention is not limited to the high speed memory chip module 100 including the type memory cell array group 101 which includes the memory cell array IC 102 and the memory cell array IC 104, and also not limited to the memory cell array IC 102 being a DRAM IC and the memory cell array IC 104 being a flash or non-volatile memory IC. That is to say, the memory cell array IC 102 and the memory cell array IC 104 can also be other type of memory ICs. In addition, each of the memory cell array ICs 102, 104 has an input/output (I/O) data bus and at least one memory cell array. For example, the memory cell array IC 102 has an I/O data bus 1022 and two memory cell arrays, and the memory cell array IC 104 has an I/O data bus 1042 and two memory cell arrays, where the data bus 1022 and the data bus 1042 have a wired or wireless transmission function along with the logic unit. But, the present invention is not limited to the memory cell array IC 102 having two memory cell arrays and the memory cell array IC 104 having two memory cell arrays. As shown in FIG. 1, the first transmission bus 108 coupled to the type of memory cell array group 101 has a first programmable transmitting or receiving data rate, a first programmable transmitting or receiving signal swing, a first programmable bus width, a first programmable data width, a first programmable address width, and a combination thereof. In addition, programmability of the first transmission bus 108 is associated at least with a one-time programming (OTP) memory, a multi-time programming (MTP) memory, a Flash Memory, an embedded memory, a register, firmware or software of the electronics system device or memory chip module. In addition, the present invention can utilize poly fuses, metal fuses, antifuse, or e-fuses to implement the OTP function or the MTP function of the first transmission bus 108. As exemplary cases, the transmitting or receiving data rate of the first transmission bus 108 can be assigned or registered as a SDR (Single Data Rate), a DDR (Double Data Rate), a DDR2 (Quadruple Data Rate) or the like. As other exemplary cases, the data rate can be linked to a given maximum or minimum operating frequency associated with the programmability of this invention. As further exemplary case, the first programmable transmitting or receiving signal swing can be assigned or registered as a LVTTL (Low Voltage Transistor-transistor logic) swing, a CMOS LVTTL swing, a LVDS (Low-voltage differential signaling) swing, a HSTL (High-speed transceiver logic) swing, a SSTL (Stub Series Terminated Logic) swing or the like. As a result, the electronics system device or memory chip module can adjust its bus swing either by a predetermined value or other values associated with the programmability of this invention such that it can achieve higher performance, lower operating power, lower standby power, longer battery life or another functional enhancement. The logic unit 106 is used for accessing the memory cell array IC 102 and the memory cell array IC 104 through a first transmission bus 108, where the first transmission bus 108 is used for transmitting a first set of parallel data, and bus width (e.g. 128 bits or 256 bits or more) of the first transmission bus 108 is wider than bus width (e.g. 8 bits or 16 bits or more) of the I/O data bus 1022 and bus width (e.g. 8 bits or 16 bits or more) of the I/O data bus 1042. When the logic unit 106 accesses the first set of parallel data through the first transmission bus 108, the logic unit 106 utilizes a bus width parallel-to-serial controller 1062 included thereof to convert the first set of parallel data into a second set of parallel data, and transmits the second set of parallel data to an application-specific integrated circuit (ASIC) 112 (or system on chip (SOC) processor) through a second transmission bus 110 (e.g., for instance, a 32 bits serial or parallel transmission bus) further included in the I/O module of the high speed memory chip module 100. The second transmission bus 110 has a second programmable transmitting or receiving data rate, a second programmable transmitting or receiving signal swing, a second programmable bus width, a second programmable data width, a second programmable address width, and a combination thereof. The second transmission bus 110, as exemplary cases, the second transmission bus 110 can be a parallel bus comprised multiple lanes of serial bus protocol associated with a Universal Serial Bus 2.0 (USB 2.0), a USB 3.0, a Serial Advanced Technology Attachment (SATA) bus, a Universal Flash Storage (UFS) bus, a mobile industry processor interface (MIPI) bus, or a Peripheral Component Interconnect Express (PCIE) bus. As other exemplary cases, the second transmission bus 110 can be a parallel bus with a protocol comprising SDR, DDR, DDR2 or the like. In addition, programmability of the second transmission bus 110 is associated at least with an OTP memory, an MTP memory, a Flash Memory, an embedded memory, a register, firmware or software of the electronics system device or memory chip module. The present invention can utilize poly fuses, metal fuses, anti-fuse or e-fuses to implement the OTP function or the MTP function of the second transmission bus 110. As exemplary cases, the data rate of the transmitting or receiving data rate of the second transmission bus 110 can be assigned or registered as a SDR (Single Data Rate), a DDR (Double Data Rate), a DDR2 (Quadruple Data Rate) or the like. As other exemplary cases, the data rate can be linked to a given operating frequency associated with the programmability of this invention. As further exemplary case, the second programmable transmitting or receiving signal swing can be assigned or registered as a LVTTL (Low Voltage Transistor-transistor logic) swing, a CMOS LVTTL swing, a LVDS (Low-voltage differential signaling) swing, a HSTL (High-speed transceiver logic) swing, a SSTL (Stub Series Terminated Logic) swing or the like. The electronics system device or memory chip module can adjust its bus swing either by a predetermined value or other values associated with the programmability of this invention such that it can achieve higher performance, lower operating power, lower standby power, longer battery life or another functional enhancement. Then, the ASIC processor 112 can execute a predetermined function according to the second set of parallel data. As shown in FIG. 1, the logic unit 106 can be designed as a "parallel-to-serial bus" bridge, receives the first set of parallel data through the first transmission bus 108 with wider bus width (e.g. 128 bits or 256 bits or more), and utilizes the parallel-to-serial controller 1062 to convert the first set of parallel data into the second set of serial or parallel data. In addition, the second transmission bus 110 and the first transmission bus 108 can also be comprised of wireless transmission buses to optimize between the power and throughput performance. For example, the second transmission bus 110 and the first transmission bus 108 can be buses for transmitting light, optical signal or electromagnetic waves. As mentioned in one embodiment, the system power efficiency can be higher if bit width of the first transmission bus is wider and with smaller signal swing comparing to the second transmission bus. On the other hand, in another embodiment, the system data transmission bandwidth and noise level can be best optimized for another application environments or conditions if the second transmission bus is wider and with smaller signal swing comparing to the first transmission bus. In addition, because the first transmission bus 108 has the first programmable transmitting or receiving data rate, the first programmable transmitting or receiving signal swing, the first programmable bus width, the first programmable data width, and/or the first programmable address width, and the second transmission bus 110 has the second programmable transmitting or receiving data rate, the second programmable transmitting or receiving signal swing, the second programmable bus width, the second programmable data width, and/or the second programmable address width, thus the high speed memory chip module 100 can save power or optimize performance thereof, resulting in the high speed memory chip module 100 having higher manufacturability, higher flexibility, and lower system migration cost among different process technology generations and different applications.

In addition, the first programmable transmitting or receiving data rate, the first programmable transmitting or receiving signal swing, the first programmable bus width, the first programmable data width, and the first programmable address width of the first transmission bus 108 have first predetermined values. The second programmable transmitting or receiving data rate, the second programmable transmitting or receiving signal swing, the second programmable bus width, the second programmable data width, and the second programmable address width of the second transmission bus 110 have second predetermined values. Therefore, when the ASIC processor 112 (or the SOC processor) is connected to the high speed memory chip module 100 through the second transmission bus 110, the ASIC processor 112 (or the SOC processor) can take the advantage of the first predetermined values and the second predetermined values to optimize performance of the first transmission bus 108 and the second transmission bus 110 without further programming efforts. That is to say, the first predetermined values and the second predetermined values can be revised or updated by the ASIC 112 processor later on if required through at least an OTP memory, an MTP memory, a Flash Memory, an embedded memory, a register, firmware or software of the ASIC 112 processor. Thus, the high speed memory chip module 100 can execute corresponding changes on the first predetermined values and the second predetermined values according to various application environments and conditions. The high speed memory chip module 100 not only can be applied to various ASIC processors (or various SOC processors), but can also reduce cost of the high speed memory chip module 100 and enhance the performance of the high speed memory chip module 100 without bearing the unwanted inventory cost of different configuration of memory chip modules. In addition, operation frequencies and operation voltages of the first transmission bus 108 and the second transmission bus 110 can also be varied dynamically associate with the ASIC processor 112 to enhance the performance of the high speed memory chip module 100.

In an embodiment of the present invention, the type of memory cell array group 101, the first transmission bus 108, and the logic unit 106, the second transmission bus 110, the ASIC processors (or various SOC processors) are packaged in one encapsulate together. In another embodiment of the present invention, the type of memory cell array group 101 and the first transmission bus 108 are packaged together, and the second transmission bus 110 and the logic unit 106 are packaged together. In further embodiment of the present invention, the type of memory cell array group 101, the first transmission bus 108, the second transmission bus 110, the ASIC processor 112, and the logic unit 106 are packaged together, that is, the high speed memory chip module 100 can include the ASIC processor 112 putting together into one single packaged body.

Figure 2:
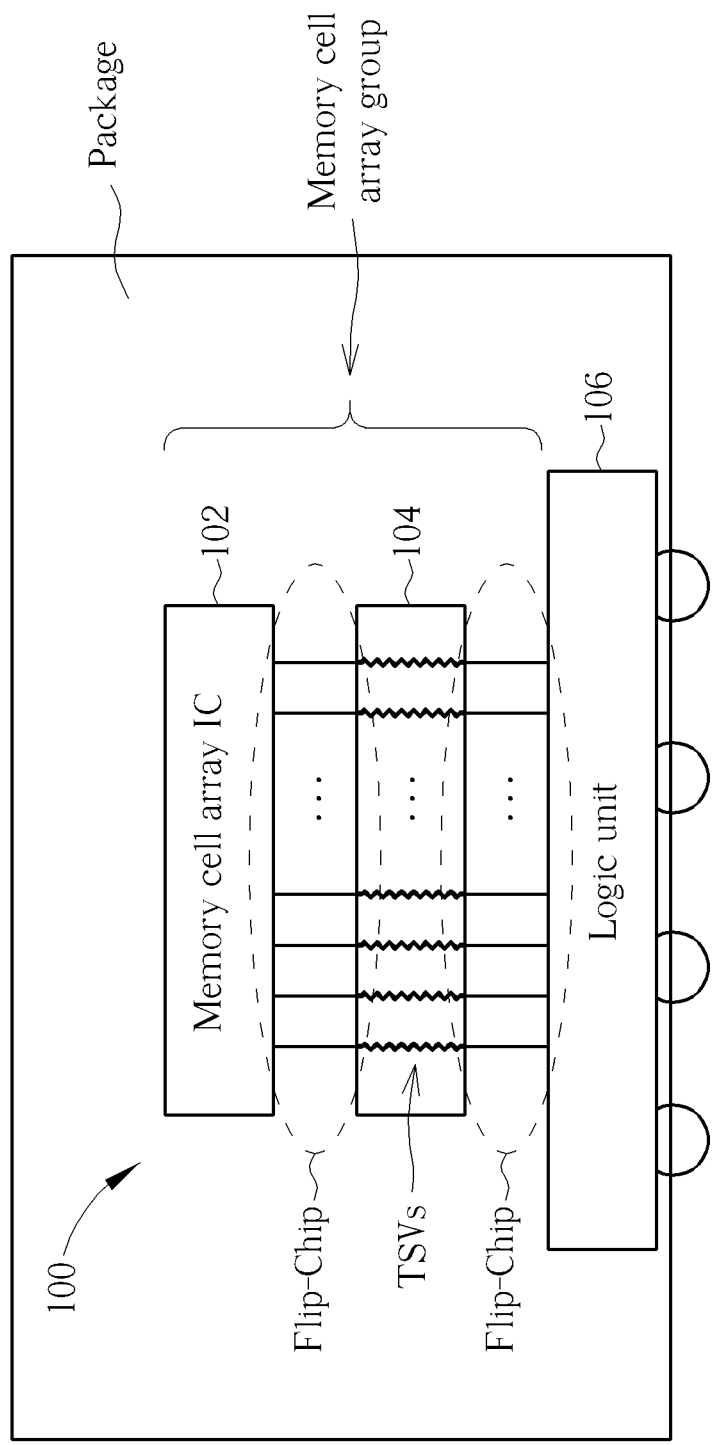
FIG. 2 is a diagram illustrating a cross-section of the high speed memory chip module.

Please refer to FIG. 2. FIG. 2 is a diagram illustrating a cross-section of the high speed memory chip module 100. As shown in FIG. 2, the memory cell array IC 102, the memory cell array IC 104, and the logic unit 106 are stacked each other (the memory cell array IC 102 and the memory cell array IC 104 are stacked over the logic unit 106) through Flip-Chip, where the Flip-Chip forms bumps on pads of the memory cell array IC 102, the memory cell array IC 104, and the logic unit 106, and then utilizes the bumps to make the memory cell array IC 102, the memory cell array IC 104, and the logic unit 106 be stacked over each others.

Figure 3:
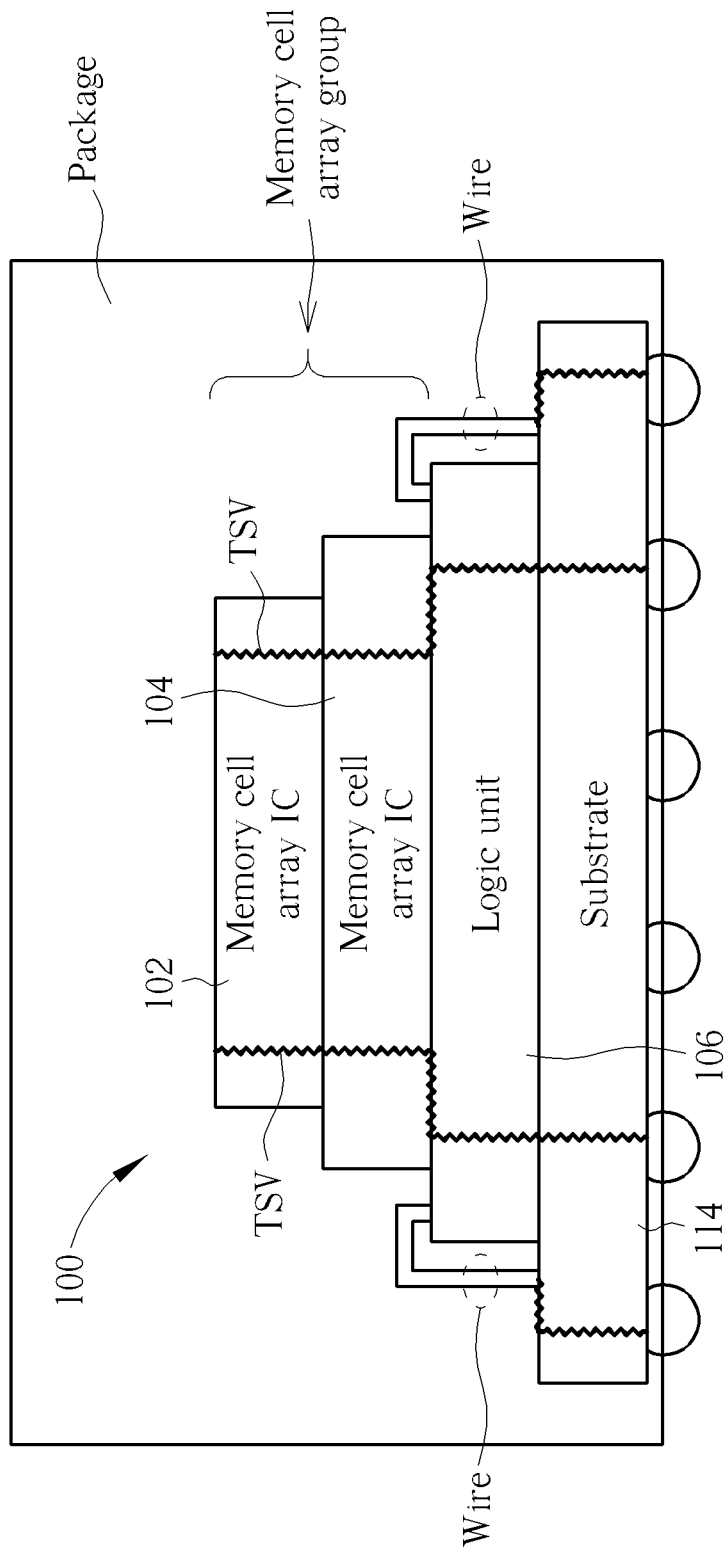
FIG. 3 is a diagram illustrating a cross-section of the high speed memory chip module according to another embodiment.

Please refer to FIG. 3. FIG. 3 is a diagram illustrating a cross-section of the high speed memory chip module 100 according to another embodiment. As shown in FIG. 3, the memory cell array IC 102, the memory cell array IC 104, and the logic unit 106 utilize both TSV and wire bonding structures to connect to a substrate 114, where the memory cell array IC 102 and the memory cell array IC 104 are stacked over the logic unit 106. In another embodiment, the logic unit 106 utilizes TSV to connect to the memory cell array IC 102 and utilizes wire bonding to another integrated circuit (IC) with function including an analog function, a digital signal processing (DSP) function, a communication function, a wireless fidelity (Wi-Fi) function, a power management function, a mix-mode function, an RF function, a micro electro mechanical systems (MEMS) function, or the like.

Figure 4:
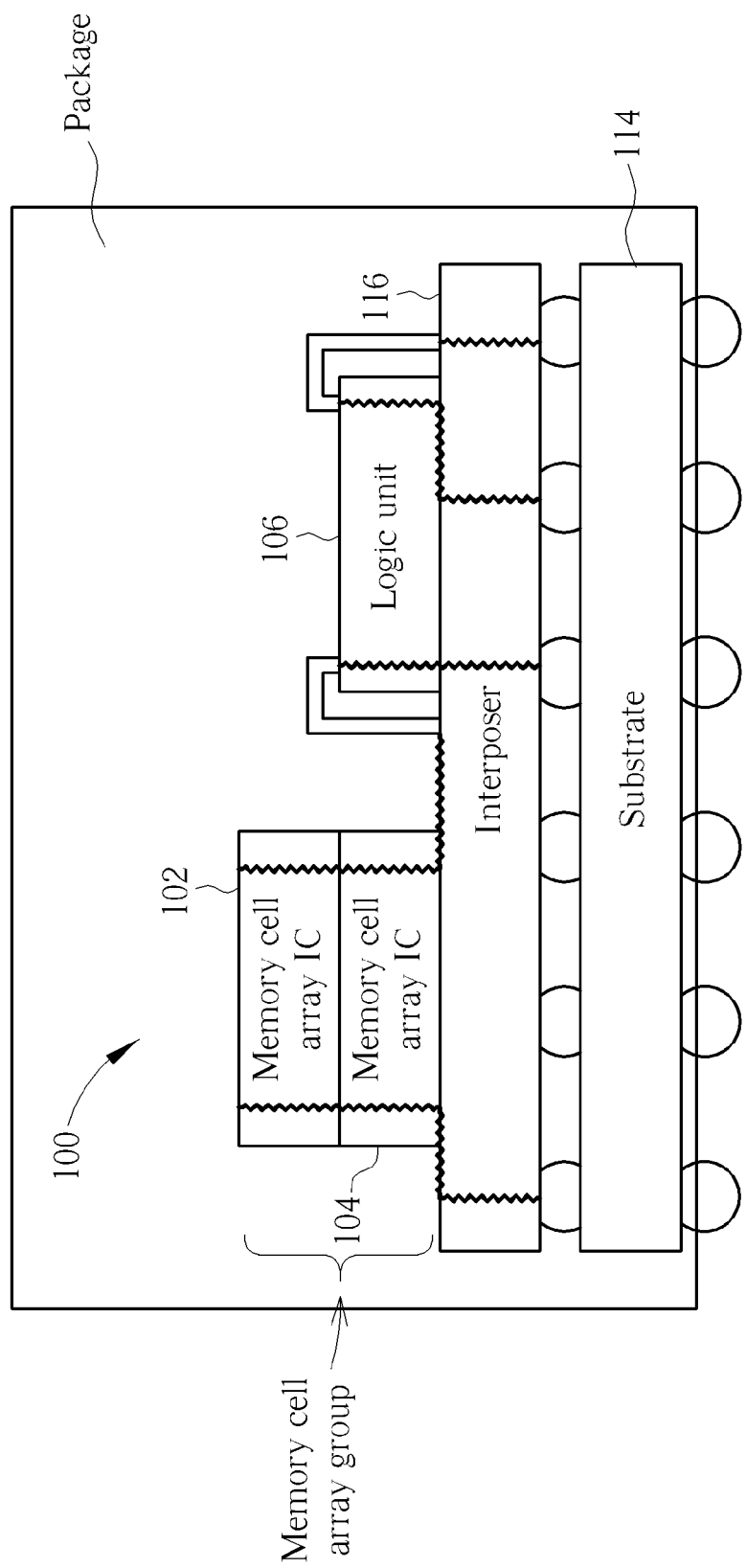
FIG. 4 is a diagram illustrating a cross-section of the high speed memory chip module according to another embodiment.

Please refer to FIG. 4. FIG. 4 is a diagram illustrating a cross-section of the high speed memory chip module 100 according to another embodiment. As shown in FIG. 4, the high speed memory chip module 100 further includes an interposer 116, where the interposer 116 can be silicon material or oxide glass material. But, the present invention is not limited to the interposer 116 being the silicon material or the oxide glass material. As shown in FIG. 4, the memory cell array IC 102 is stacked over the memory cell array IC 104, and the memory cell array IC 104 and the logic unit 106 are disposed over the two opposite sides of the interposer 116, respectively. In addition, the memory cell array IC 102, the memory cell array IC 104, and the logic unit 106 can utilize the wire bonding, the Flip-Chip, through silicon vias (TSVs), or wireless transmission to connect to each other.

Figure 5:
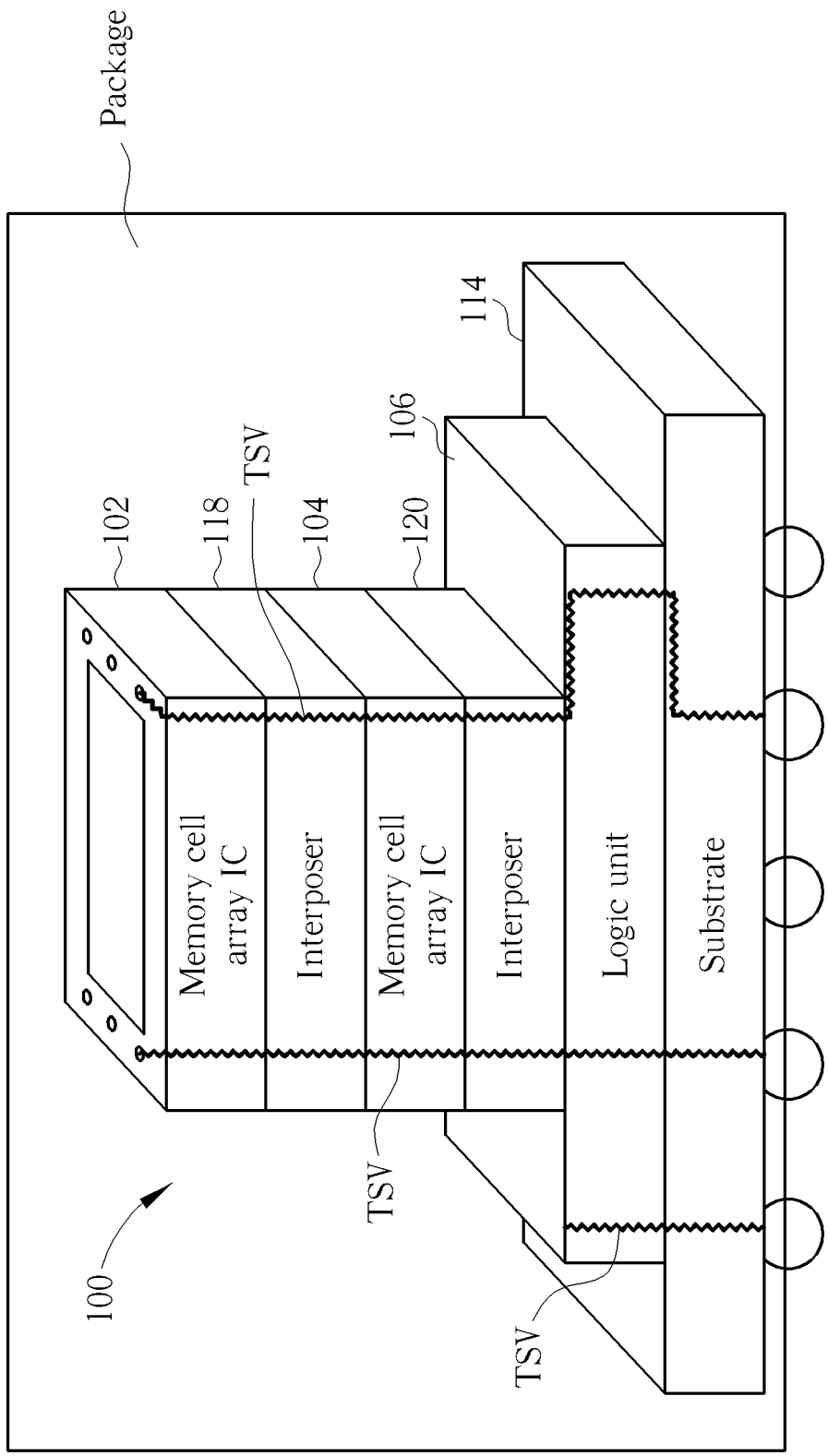
FIG. 5 is a diagram illustrating a cross-section of the high speed memory chip module according to another embodiment.

Please refer to FIG. 5. FIG. 5 is a diagram illustrating a cross-section of the high speed memory chip module 100 according to another embodiment. As shown in FIG. 5, the high speed memory chip module 100 further includes interposers 118, 120. As shown in FIG. 5, the memory cell array IC 102 is stacked over the interposer 118, the interposer 118 is stacked over the memory cell array IC 104, the memory cell array IC 104 is stacked over the interposer 120, the interposer 120 is stacked over the logic unit 106, and the logic unit 106 is stacked over the substrate 114. In addition, the memory cell array IC 102, the memory cell array IC 104, and the logic unit 106 can utilize the wire bonding, the Flip-Chip, the TSVs, or the wireless transmission to connect to each other.

Figure 6:
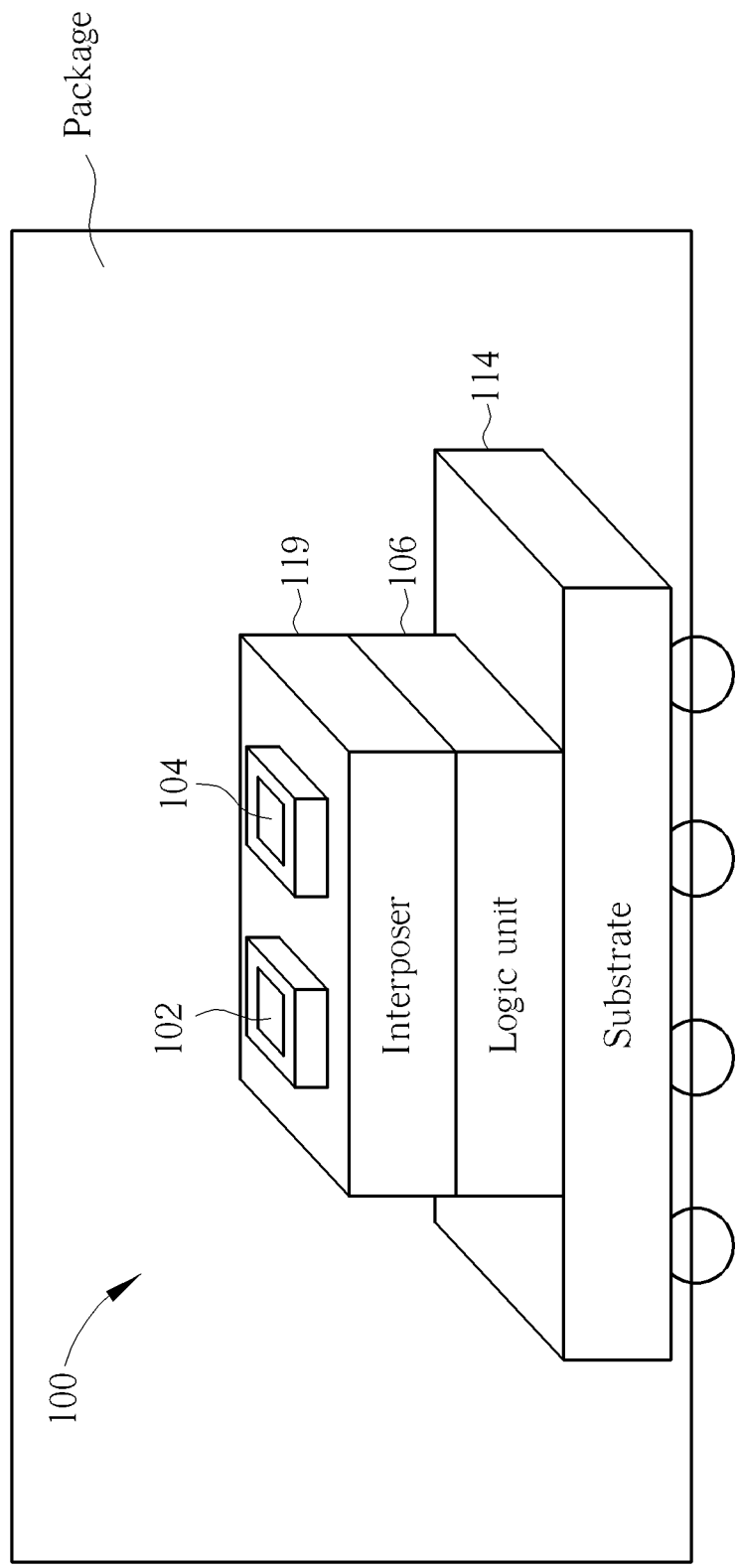
FIG. 6 is a diagram illustrating a cross-section of the high speed memory chip module according to another embodiment.

Please refer to FIG. 6. FIG. 6 is a diagram illustrating a cross-section of the high speed memory chip module 100 according to another embodiment. As shown in FIG. 6, the high speed memory chip module 100 further includes an interposer 119. As shown in FIG. 6, the memory cell array IC 102 and the memory cell array IC 104 are stacked over the interposer 119, the interposer 119 is stacked over the logic unit 106, and the logic unit 106 is stacked over the substrate 114. In addition, the memory cell array IC 102, the memory cell array IC 104, and the logic unit 106 can utilize the wire bonding, the Flip-Chip, the TSVs, or the wireless transmission to connect to each other or connect to a third integrated circuit (IC) with function characterized with an analog function, a digital signal processing (DSP) function, a communication function, a wireless fidelity (Wi-Fi) function, a power management function, a mix-mode function, an RF function, a micro electro mechanical systems (MEMS) function, or the like.

In addition, packages of the high speed memory chip modules in FIG. 2 to FIG. 6 can be Package-in-Package (PIP), Package on package (POP), or System in Package (SIP). In addition, the high speed memory chip modules in FIG. 2, FIG. 3, FIG. 5, and FIG. 6 are exemplary packages of three-dimensional (3D) structure, and the high speed memory chip module in FIG. 4 is an exemplary package of mixed 3D plus 2.5D structure. In addition, in FIG. 2, the logic unit 106 can be connected to a substrate or a motherboard through the wire bonding pad, the Flip-Chip bumps, the TSVs, or the wireless transmission structures.

In addition, a signal swing of data transmitted through the first transmission bus 108 (that is, a voltage difference between a logic level "0" and a logic level "1" transmitted through the first transmission bus 108) is the same as a signal swing of data received through the first transmission bus 108 (e.g. 1.8V), where the signal swing of data transmitted through the first transmission bus 108 and the signal swing of data received through the first transmission bus 108 can be varied with different memory standards of the memory cell array ICs 102, 104. In addition, for saving power, the logic unit 106 can adjust a signal swing (e.g. 1.8V) of data inputted to the logic unit 106 from the first transmission bus 108 to another or lower signal swing (e.g. 1.2V) inputted to the second transmission bus 110 from the logic unit 106. In addition, a signal swing of data transmitted through the second transmission bus 110 can be the same as a signal swing of data received through the second transmission bus 110 (e.g. 1.2V) whenever required.

In addition, because a semiconductor process of the memory cell array ICs 102, 104 may be different from semiconductor processes of the logic unit 106 and the ASIC (or SOC) processor 112 (e.g. the semiconductor process of the memory cell array ICs 102, 104 can be a 0.13 um-90 nm semiconductor process, the semiconductor process of the logic unit 106 can be a 28 nm-20 nm process, and the process of the ASIC (OR SOC) processor 112 can be a 28 nm-13 nm semiconductor process), the metal-oxide-semiconductor field-effect transistor (MOSFET) gate length of the semiconductor process of the memory cell array ICs 102, 104 is usually longer than the MOSFET gate length of the semiconductor processes of the logic unit 106 and the ASIC (or SOC) processor 112. In another embodiment of the present invention, a signal swing of data transmitted through the first transmission bus 108 can be different from a signal swing of data received through the first transmission bus 108, and a signal swing of data transmitted through the second transmission bus 110 can also be different from a signal swing of data received through the second transmission bus 110.

In addition, in another embodiment of the present invention, a signal swing of data transmitted through the first transmission bus 108 can be different from a signal swing of data received through the first transmission bus 108, and a signal swing of data transmitted through the second transmission bus 110 can be the same as a signal swing of data received through the second transmission bus 110.

In addition, in another embodiment of the present invention, a signal swing of data transmitted through the first transmission bus 108 can be the same as a signal swing of data received through the first transmission bus 108, and a signal swing of data transmitted through the second transmission bus 110 can be different from a signal swing of data received through the second transmission bus 110.

For saving power and take the advantage of different semiconductor processes, in another embodiment of the present invention, a transmitting data rate of the first transmission bus 108 can be different from a receiving data rate of the first transmission bus 108, and a transmitting data rate of the second transmission bus 110 can also be different from a receiving data rate of the second transmission bus 110. In addition, in another embodiment of the present invention, the transmitting data rate of the first transmission bus 108 can be the same as the receiving data rate of the first transmission bus 108, and the transmitting data rate of the second transmission bus 110 can also be the same as the receiving data rate of the second transmission bus 110. In addition, in another embodiment of the present invention, a transmitting data rate of the first transmission bus 108 can be different from a receiving data rate of the first transmission bus 108, and a transmitting data rate of the second transmission bus 110 can also be different from a receiving data rate of the second transmission bus 110, and a signal swing of data transmitted through the first transmission bus 108 can be different from a signal swing of data received through the first transmission bus 108, and a signal swing of data transmitted through the second transmission bus 110 can also be different from a signal swing of data received through the second transmission bus 110.

In addition, as shown in FIG. 1, the type of memory cell array group 101 composed of the memory cell array IC 102 and the memory cell array IC 104 can have different size and bus width. For example, if size and bus width of each memory cell array of the memory cell array IC 102 and the memory cell array IC 104 are 512M and 32 bits, size and bus width of the type of memory cell array group 101 can be 512M and 128 bits, or 1G and 64 bits. But, the present invention is not limited to size and bus width of the type of memory cell array group 101 composed of the memory cell array IC 102 and the memory cell array IC 104 being 512M and 128 bits, or 1G and 64 bits. In addition, if size and bus width of the memory cell array IC 102 are 512M and 64 bits and size and bus width of the memory cell array IC 104 are 1G and 64 bits, size and bus width of the type of memory cell array group 101 composed of the memory cell array IC 102 and the memory cell array IC 104 can be 1.5G and 128 bits.

Figure 7:
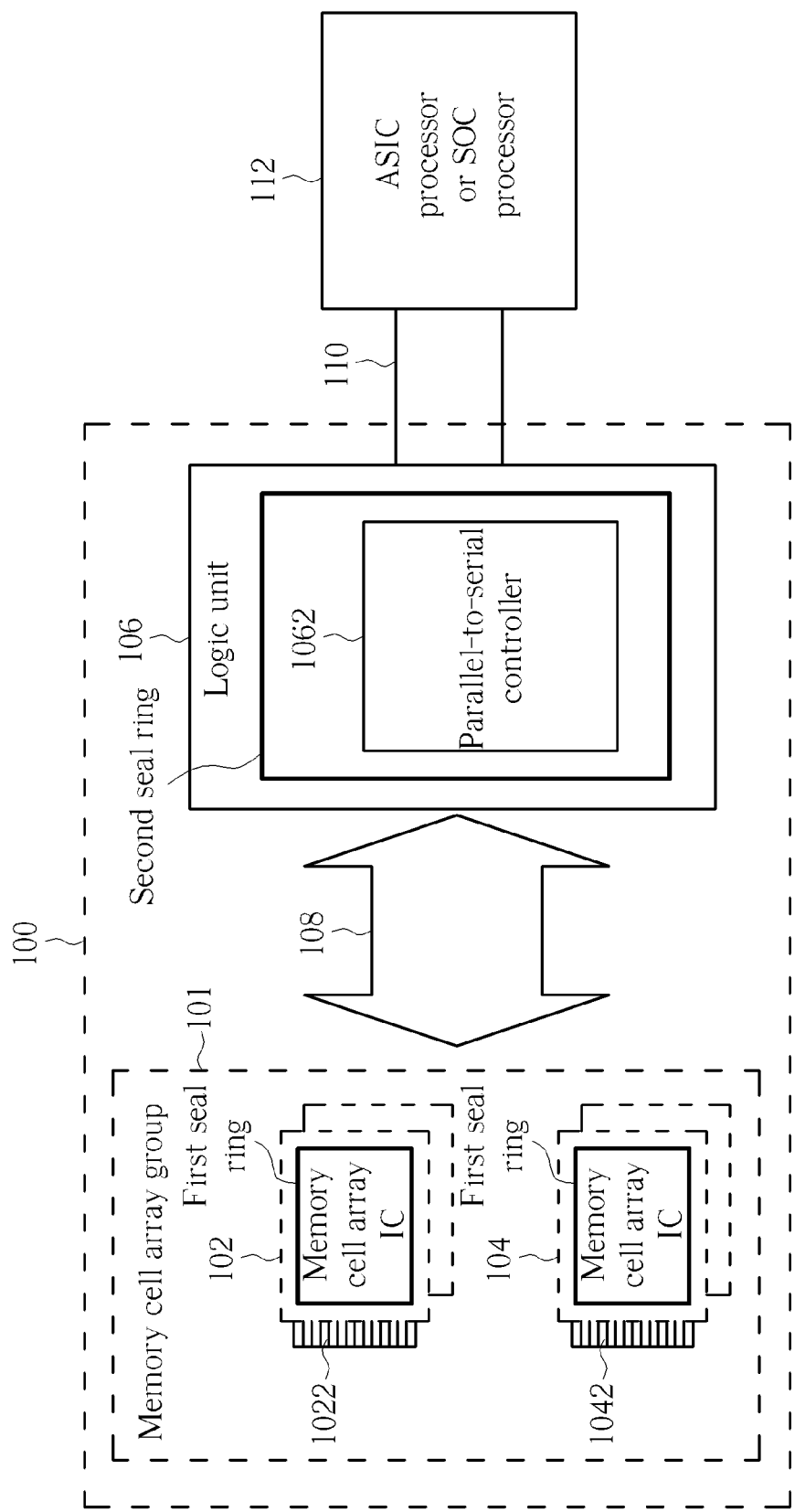
FIG. 7 is a diagram illustrating each of the memory cell array ICs corresponding to a first seal ring and the logic unit corresponding to a second seal ring.

Please refer to FIG. 7. FIG. 7 is a diagram illustrating each of the memory cell array IC 102 and the memory cell array IC 104 corresponding to a first seal ring and the logic unit corresponding to a second seal ring. As shown in FIG. 7, a circuit of each of the memory cell array IC 102 and the memory cell array IC 104 is surrounded by a first seal ring and a circuit of the logic unit 106 is surrounded by the second seal ring.

Figure 8:
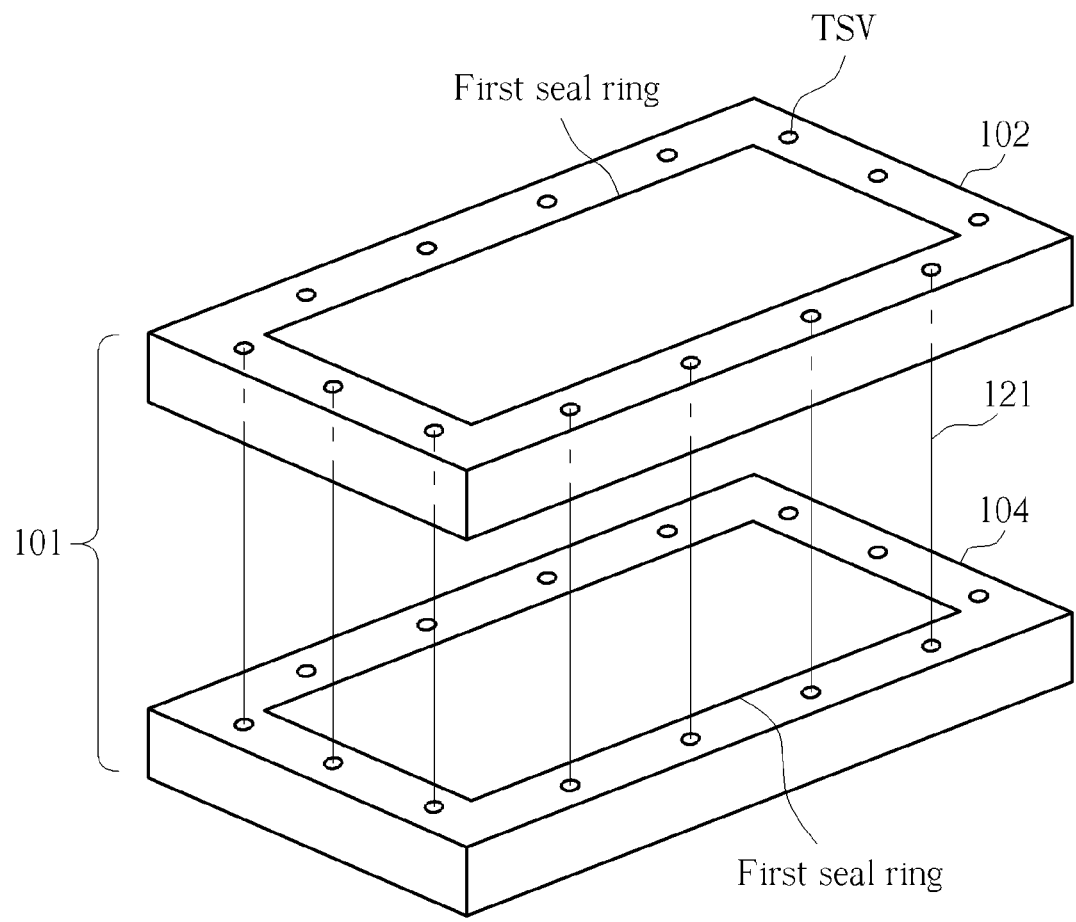
FIG. 8 is an explosion diagram illustrating a plurality of TSVs existing outside a first seal ring of each of the memory cell array ICs, where the plurality of TSVs are used for connecting to a power or a ground supply.

Please refer to FIG. 8. FIG. 8 is an explosion diagram illustrating a plurality of TSVs existing outside a first seal ring of each of the memory cell array ICs, where the plurality of TSVs are used for connecting to a power or a ground supply. But, the present invention is not limited to a plurality of TSVs existing outside a first seal ring of each memory cell array IC. That is to say, at least one TSV exists outside a first seal ring of each memory cell array IC. As shown in FIG. 8, relative positions and an amount of a plurality of TSVs existing outside a first seal ring of each memory cell array IC are the same. Because relative positions and an amount of a plurality of TSVs existing outside a first seal ring of each memory cell array IC are the same, when the memory cell array IC 102 and the memory cell array IC 104 are stacked each other, a metal fence 121 surrounding (in four sides) or partially surrounding (in one, two or three sides) the memory cell array IC 102 and the memory cell array IC 104 can be formed through a plurality of TSVs existing outside a first seal ring of each memory cell array IC (FIG. 8 only shows two sides of the metal fence 121), where the metal fence 121 has electromagnetic interference (EMI) shielding effect, better heat dissipation capability, and with better external noise isolation functions. In addition, because a plurality of TSVs existing outside a first seal ring of each memory cell array IC are used for connecting to the power or the ground supply, power or ground line areas within a first seal ring of each memory cell array IC for connecting to the power or the ground supply can be saved.

Figure 9:
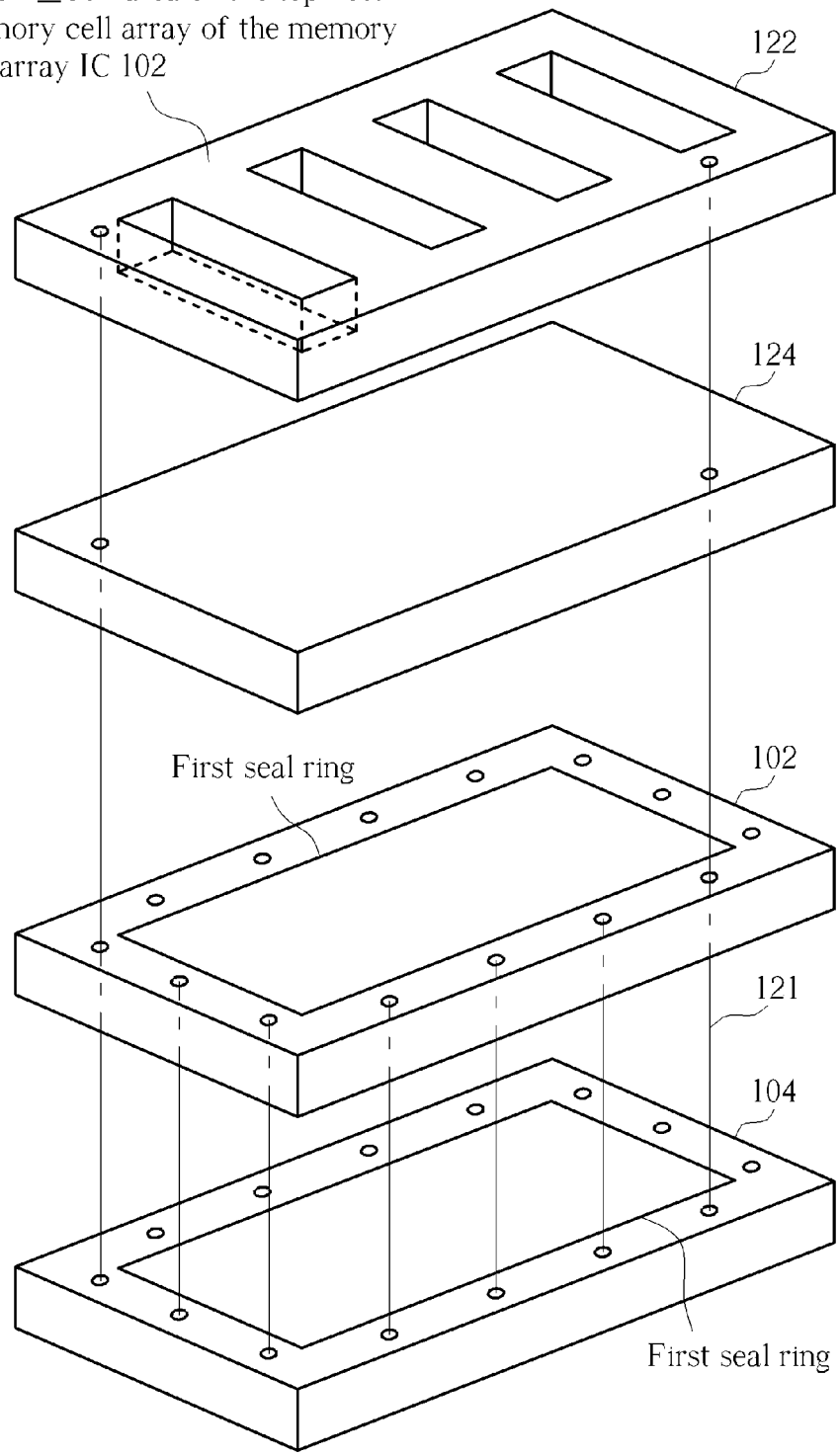
FIG. 9 is an explosion diagram illustrating the high speed memory chip module further including a metal layer and an insulation layer when the high speed memory chip module has the 3D structure.

Please refer to FIG. 9. FIG. 9 is an explosion diagram illustrating the high speed memory chip module 100 further including a metal layer 122 and an insulation layer 124 when the high speed memory chip module 100 has the 3D structure. As shown in FIG. 9, the metal layer 122 is disposed over a topmost memory cell array of the memory cell array IC 102, and the insulation layer 124 is disposed between the metal layer 122 and the topmost memory cell array of the memory cell array IC 102, where the metal layer 122 can be electrically connected to the topmost memory cell array of the memory cell array IC 102 through at least one TSV of the insulation layer 124, and the metal layer 122, which can be a single piece or a slotted piece, covers more than about 50% area of the topmost memory cell array of the memory cell array IC 102. In another embodiment, the metal layer can be connected to a power or a ground supply through a least one TSV as to perform better EMI shielding performance.

Figure 10:
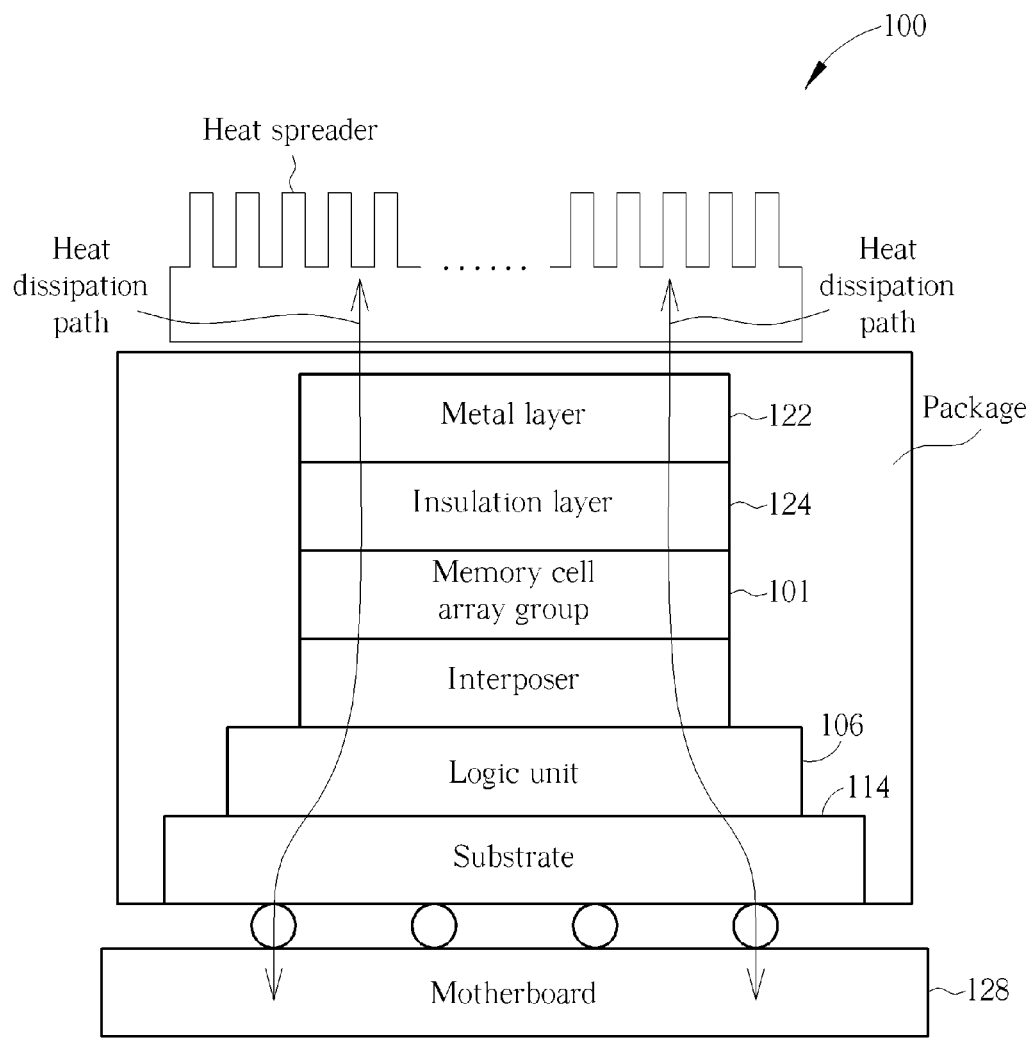
FIG. 10 is a cross-section diagram illustrating heat dissipation paths of the high speed memory chip module in FIG. 9.

Please refer to FIG. 10. FIG. 10 is a cross-section diagram illustrating heat dissipation paths of the high speed memory chip module 100 in FIG. 9. As shown in FIG. 10, the high speed memory chip module 100 can utilize a plurality of TSVs existing outside first seal rings of the memory cell array IC 102 to upward dissipate heat through the metal layer 122, or utilize the metal fence 121 to dissipate heat to a substrate 114 or a motherboard 128 through a plurality of TSVs of the logic unit 106 and the substrate 114 (as shown in arrows in FIG. 10).

Figure 11:
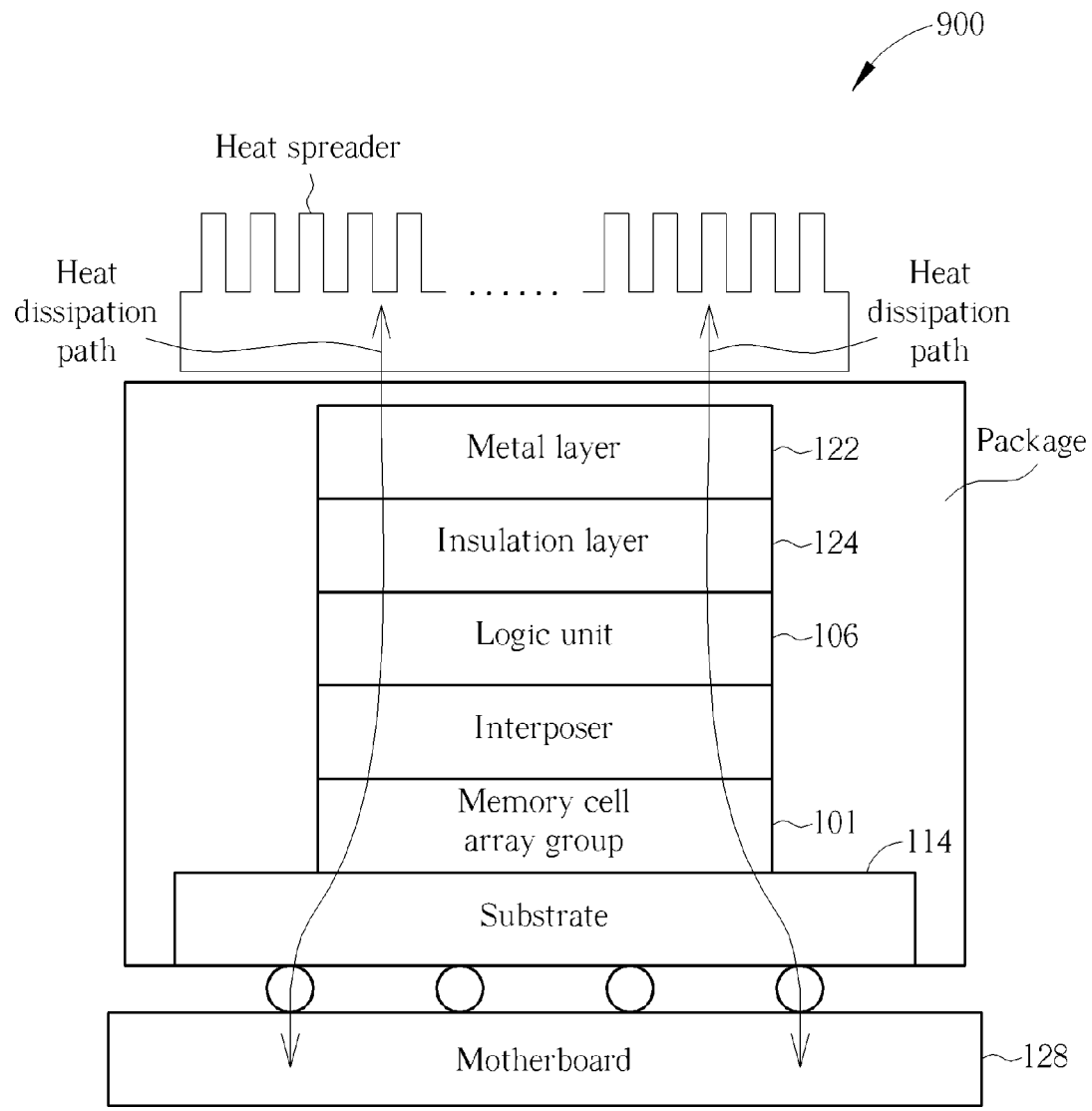
FIG. 11 is a cross-section diagram illustrating heat dissipation paths of a high speed memory chip according to another embodiment.

Please refer to FIG. 11. FIG. 11 is a cross-section diagram illustrating heat dissipation paths of a high speed memory chip 900 according to another embodiment, where a difference between the high speed memory chip module 900 and the high speed memory chip module 100 in FIG. 10 is that a logic unit 106 of the high speed memory chip module 900 is stacked over the type of memory cell array group 101. A plurality of TSVs exist outside a first seal ring of each of the memory cell array IC 102 and the memory cell array IC 104, and the plurality of TSVs existing outside the second seal ring of the logic unit 106 are used for connecting to the power or the ground supply. But, the present invention is not limited to the plurality of TSVs existing either inside or outside of the second seal ring of the logic unit 106. That is to say, at least one TSV exists outside the second seal ring of the logic unit 106. As shown in FIG. 11, the metal layer 122 is disposed over the logic unit 106, and the insulation layer 124 is disposed between the metal layer 122 and the logic unit 106, where the metal layer 122 can be electrically connected to the logic unit 106 through at least one TSV of the insulation layer 124, and the metal layer 122 covers more than about 50% area of the logic unit 106. In addition, as shown in FIG. 11, the high speed memory chip module 900 can utilize the plurality of TSVs existing outside the second seal ring of the logic unit 106 to upward dissipate heat through the metal layer 122, or utilize the metal fence 121 to dissipate heat to the motherboard 128 through the plurality of TSVs of the substrate 114 (as shown in arrows in FIG. 11). In addition, because the plurality of TSVs existing outside the second seal ring of the logic unit 106 are used for connecting to the power or the ground supply, power or ground supply line area within the second seal ring of the logic unit 106 for connecting to the power or the ground supply can be saved.

Figure 12:
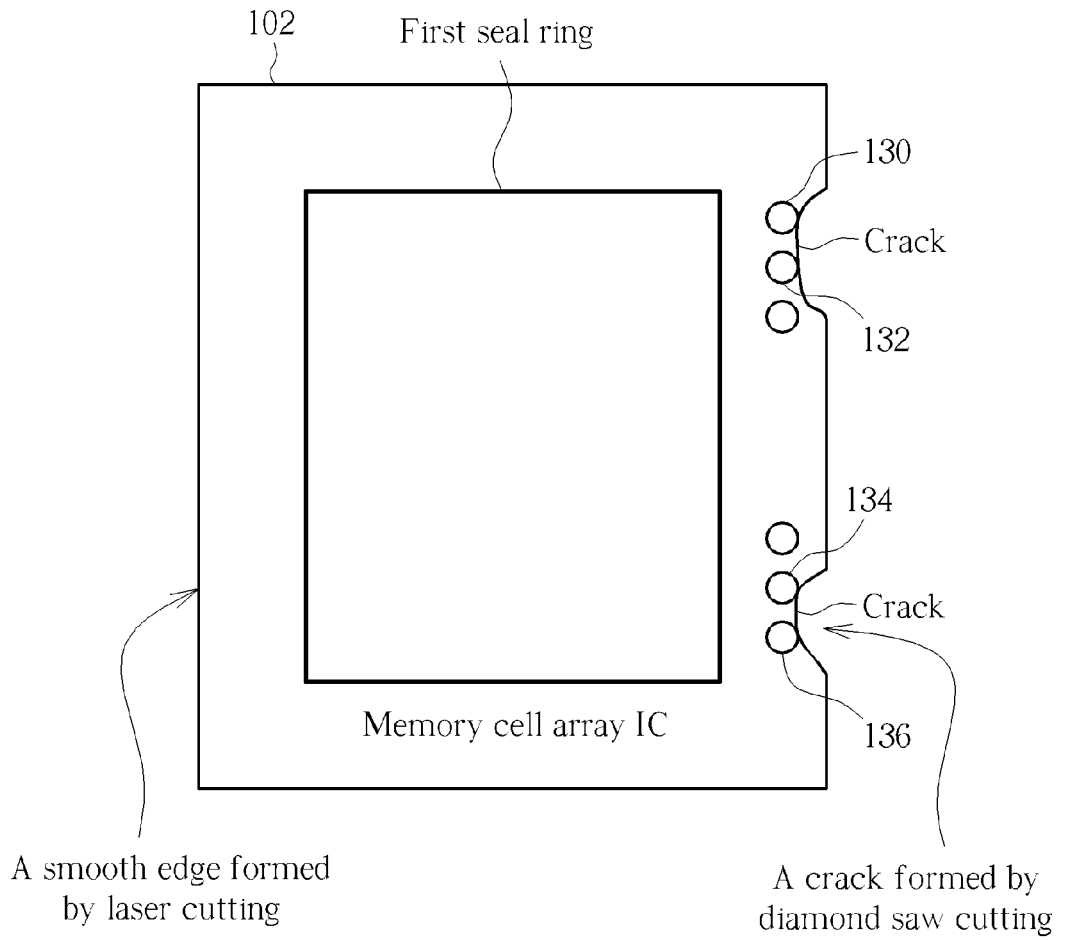
FIG. 12 is a top view illustrating an edge of the memory cell array IC showing cracks during the assembly or package manufacturing process of the high speed memory chip module in FIG. 8.

Please refer to FIG. 12. FIG. 12 is a top view illustrating an edge of the memory cell array IC 102 showing cracks during the assembly or package manufacturing process of the high speed memory chip module 100 in FIG. 8. As shown in FIG. 12, when an edge of the memory cell array IC 102 shows cracks, the cracks will not impact the nominal function of the memory cell array IC and it will just make TSVs 130, 132 connected to the power short-circuit together, and TSVs 134, 136 connected to the ground supply short-circuit together. Thus, because the TSVs 130, 132 are short-circuit together, and the TSVs 134, 136 are short-circuit together, the metal fence 121 becomes wider, resulting in the EMI shielding effect, the heat dissipation capability, and the external noise isolation function of the metal fence 121 being enhanced. In addition, because the EMI shielding effect, the heat dissipation capability, and the external noise isolation function of the metal fence 121 are enhanced, the cracks in FIG. 12 will not impact the nominal function and as a result it can also increase the assembly or package manufacturing yield of the high speed memory chip module 100.

On the other hand, the conventional diamond-saw cutting method cannot cut the multiple memory cell array ICs into individual dies without creating the die-edge cracks. In another embodiment, to overcome the die-edge crack drawbacks of diamond-saw cutting method, the dicing or cutting method comprises at least a Laser cutting or dicing process step for at least one of the multiple memory cell array ICs. As an exemplary case, the multiple memory cell array ICs can be treated by the Laser cutting process step either before or after a conventional diamond saw cutting steps to reduce the die-edge cracks and improve the manufacturing yield and final system device level reliability.

Figure 13:
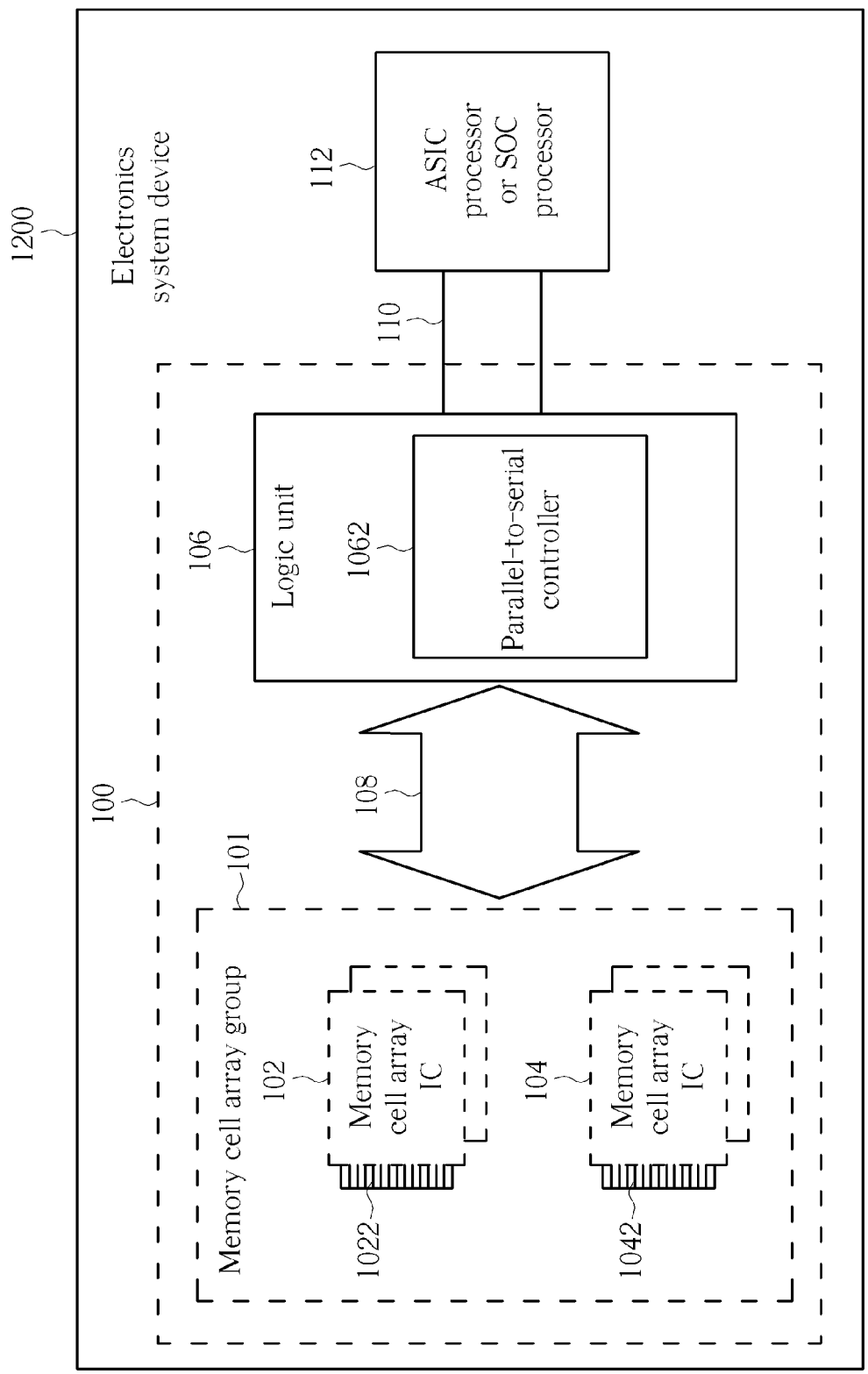
FIG. 13 is a diagram illustrating a electronics system device with a high speed memory chip module according to another embodiment.

Please refer to FIG. 13. FIG. 13 is a diagram illustrating a electronics system device 1200 with a high speed memory chip module according to another embodiment. The electronics system device 1200 utilizes the PIP, the POP, or the SIP to integrate the ASIC (or SOC) processor 112, the memory cell array IC 102, the memory cell array IC 104, and the logic unit 106. Because the ASIC (or SOC) processor 112, the memory cell array IC 102, the memory cell array IC 104, and the logic unit 106 are the same as the ASIC (or SOC) processor 112, the memory cell array IC 102, the memory cell array IC 104, and the logic unit 106 in FIG. 1, so further descriptions thereof are omitted for simplicity.

Figure 14:
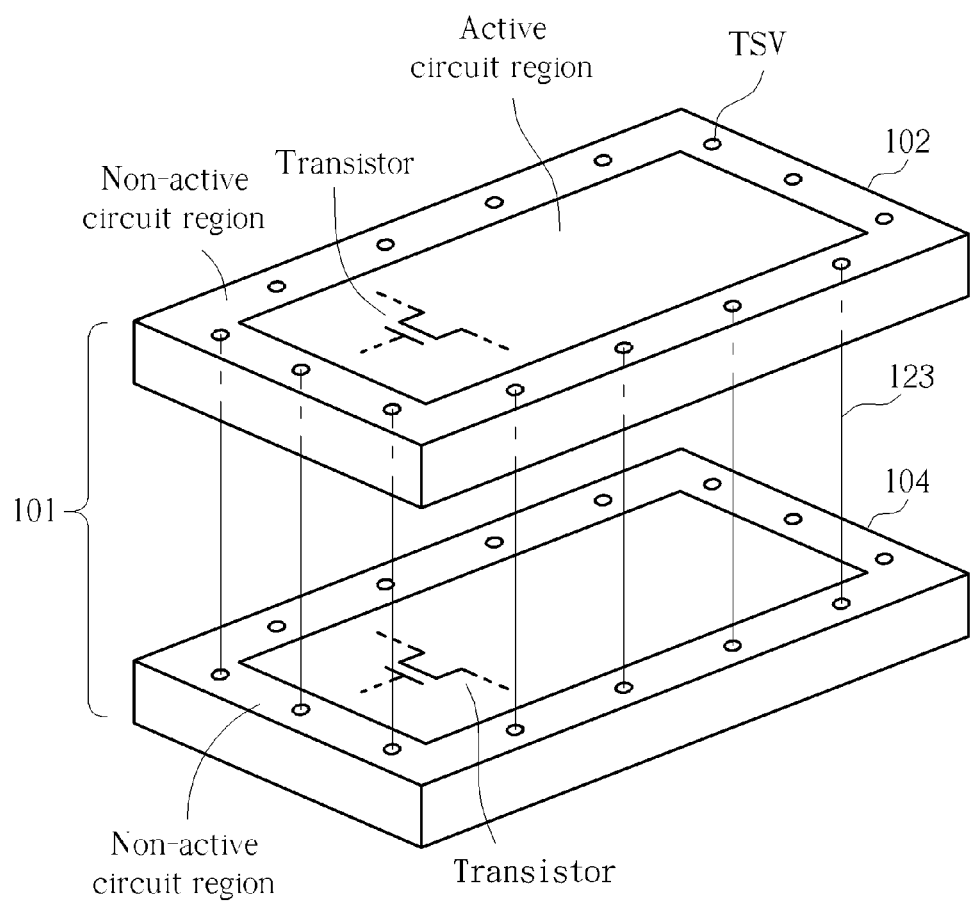
FIG. 14 is an explosion diagram illustrating a plurality of TSVs exists within a non-active circuit region surrounding or partially surrounding an active circuit region of each of the memory cell array ICs according to another embodiment.

Please refer to FIG. 14. FIG. 14 is an explosion diagram illustrating a plurality of TSVs exist within a non-active circuit region surrounding (in four sides) or partially surrounding (in one, two or three sides) an active circuit region of each of the memory cell array IC 102 and the memory cell array IC 104 according to another embodiment. The non-active circuit region is composed of passive elements only, such as insulator, interconnect, resistor, capacitor, inductor, junction diode, metal-oxide-semiconductor (MOS) diode, and the like) and the active circuit region is composed of active elements such as N-type metal-oxide-semiconductor field-effect transistor (MOSFET) or P-type MOSFET transistors for registering, switching and amplification application or the like purposes. In one embodiment, the non-active circuit region has a width less than about 50 to 100 um to save the chip area consumption, where the exclusion non-active region can serve the purpose of improving the dicing yield and dicing cracks induced defects. In another embodiment, at least one or a plurality of TSV has a width (or diameter) less than about 10 to 20 um and has a spacing less than about 10 to 30 um so as to further reduce the chip area and the manufacturing cost accordingly. The plurality of TSVs exist within a non-active circuit region of each memory cell array IC are used for connecting to a power or a ground supply, an active circuit region of each memory cell array IC is used for forming at least one active device (e.g. at least one transistor or MOSFET to perform registering, switching and amplification application or the like purposes) of each memory cell array IC. A non-active circuit region of each memory cell array IC further includes at least one metal layer for connection to at least one transistor, and a non-active circuit region of each memory cell array IC is not greater than about 50 to 100 um. But, the present invention is not limited to a plurality of TSVs exist within a non-active circuit region of each memory cell array IC. That is to say, at least one TSV exist within a non-active circuit region of each memory cell array IC. In addition, because a plurality of TSVs exist within a non-active circuit region of each memory cell array IC are used for connecting to the power or the ground supply, power or ground line areas within an active circuit region of each memory cell array IC for connecting to the power or the ground supply can be saved to improving the manufacturing yield and cost. In addition, a plurality of TSVs exist within a non-active circuit region of each memory cell array IC can be formed upward or downward by via first, via middle, or via last processes. As shown in FIG. 14, when the memory cell array IC 102 and the memory cell array IC 104 are stacked together, a metal fence 123 similar to the metal fence 121 can be formed through a plurality of TSVs exist within a non-active circuit region of each memory cell array IC (FIG. 14 only shows two sides of the metal fence 123). Therefore, the metal fence 123 also has EMI shielding effect, better heat dissipation capability, and with better external noise isolation functions. In addition, a plurality of TSVs also exist within a non-active circuit region surrounding (in four sides) or partially surrounding (in one, two or three sides) an active circuit region of the logic unit 106, where the plurality of TSVs exist within the non-active circuit region of the logic unit 106 are used for connecting to the power or the ground supply. The active circuit region of the logic unit 106 is used for forming at least one active device (e.g. at least one transistor MOSFET to perform registering, switching and amplification application or the like purposes.) of the logic unit 106. The non-active circuit region of the logic unit 106 further includes at least one metal layer for connection to at least one transistor, and the non-active circuit region of the logic unit 106 is not greater than about 50 to 100 um. Similar to each of the memory cell array IC 102 and the memory cell array IC 104, the plurality of TSVs exist within the non-active circuit region of the logic unit 106 can be formed upward or downward by the via first, via middle, or via last processes. In addition, a TSV of the plurality of TSVs exist within the non-active circuit region of the logic unit 106 is connected to one of the memory cell array IC 102 and the memory cell array IC 104, and the logic unit 106 further includes a wire bonding pad to connect to another IC with function being characterized with an analog function, a digital signal processing (DSP) function, a communication function, a wireless fidelity (Wi-Fi) function, a power management function, a mix-mode function, an RF function, or a micro electromechanical systems (MEMS) function. In addition, the plurality of TSVs exist within the non-active circuit region of the logic unit 106 and a plurality of TSVs exist within a non-active circuit region of each memory cell array IC also have functions shown in FIG. 11 and FIG. 12, so further description thereof is omitted for simplicity.

In addition, in another embodiment of the present invention, at least one pair of TSVs electrically coupled together to a power or ground supply exist in neighboring (i.e. non-overlapped or contacted physically, where a spacing between the pair of TSVs is less than about 10-30 um) within a non-active circuit region surrounding (in four sides) or partially surrounding (in one, two or three sides) an active circuit region of each of the memory cell array IC 102 and the memory cell array IC 104, and at least one pair of TSVs also exist in neighboring within the non-active circuit region surrounding (in four sides) or partially surrounding (in one, two or three sides) the active circuit region of the logic unit 106. Therefore, if an edge of the memory cell array IC 102 shows cracks during the assembly or package manufacturing process of the high speed memory chip module 100, the pair of TSVs can show a cracking stop function similar to FIG. 12. Thus, the cracks of the edge of the memory cell array IC 102 will not impact the nominal function and as a result it can also increase the assembly or package manufacturing yield of the high speed memory chip module 100. Accordingly, the EMI shielding effect, the heat dissipation capability, and the external noise isolation function of the metal fence 123 can also be enhanced.

Figure 15:
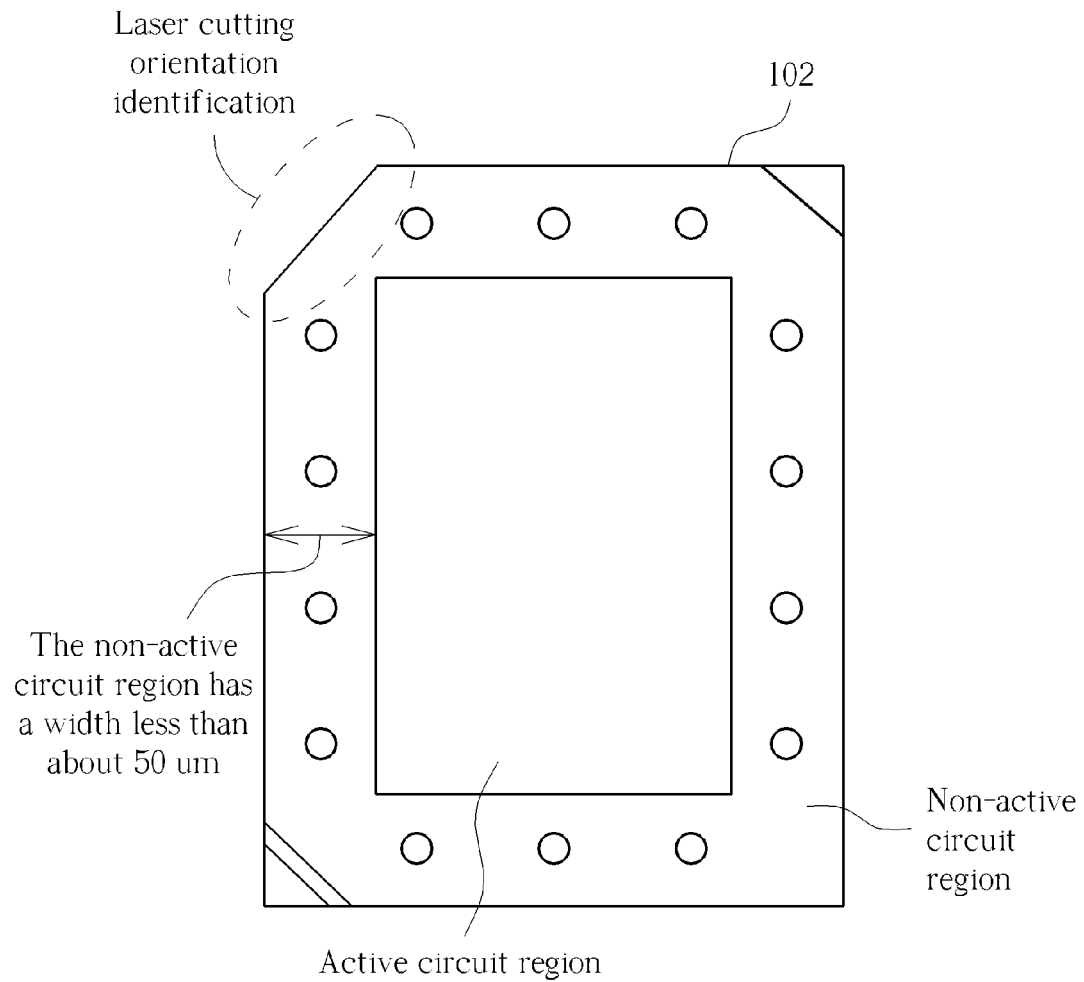
FIG. 15 and FIG. 16 are diagrams illustrating a corner of the memory cell array IC having an alignment or orientation identification mark according to another embodiment.
Figure 16:
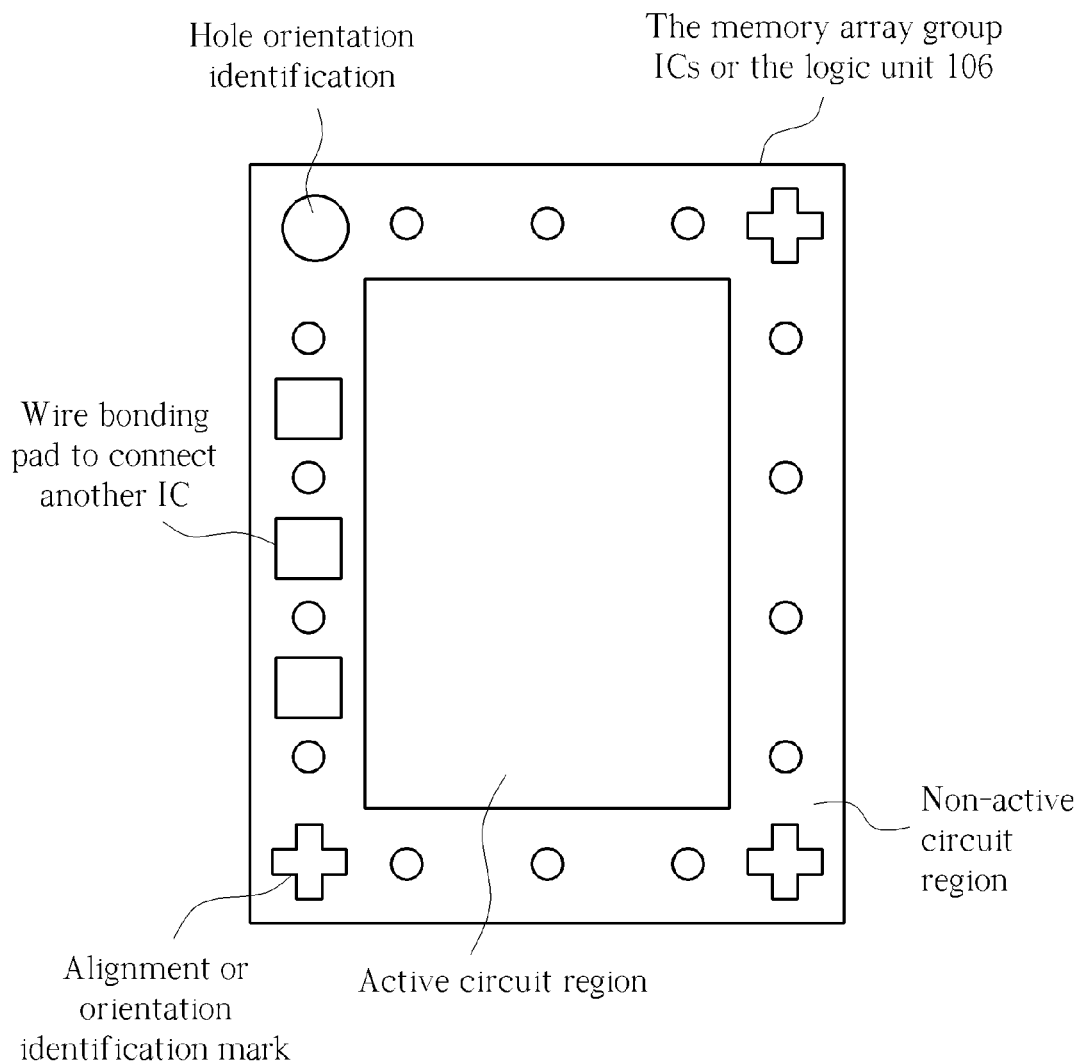

Please refer to FIG. 15. FIG. 15 is a diagram illustrating a corner of the memory cell array IC 102, the memory cell array IC 104, or the logic unit 106 having an alignment or orientation identification mark according to another embodiment, where the orientation identification mark is formed by a process comprising Laser step. The orientation identification mark can be composed of a Leaser edge cut, a line of Laser drawing mark, two lines of Laser drawing mark, at least one of a single hole, a plurality of holes, a line, two lines, or an arbitrary pattern over the memory cell array IC 102/104 or the logic unit 106 formed by conductive layer (such as Cu layer or Al layer or the like), non-conductive layer (such as a dielectric layer), Laser deposition, grooving or cutting steps. Also, to enable a better alignment process, the orientation identification mark can be filled, partially filled or not filled by additional assembly or packaging materials such as epoxy molding compound or the like. As shown in FIG. 15, an upper left corner of the memory cell array IC 102 has a laser cutting orientation identification mark, in one embodiment, where size of the laser cutting orientation identification mark is between 1 um and 15 um. FIG. 16 is a diagram illustrating a corner of the memory cell array IC 102, the memory cell array IC 104, or the logic unit 106 having an alignment or orientation identification mark according to another embodiment, where the orientation identification mark is formed over the memory cell array IC 102/104 or the logic unit 106 by a process comprising the TSV step. The orientation identification mark can be a single TSV hole, a plurality of TSV holes, a line of TSV marks, two lines of TSV marks or an arbitrary TSV pattern formed by a process comprising TSV step. Also, to enable a better alignment process, the TSV mark can be filled, partially filled or not filled by additional assembly or packaging materials such as epoxy molding compound or the like. The above mentioned alignment or orientation mark can ease the efforts to stack the memory cell array ICs 102 itself or ease the effort to stack the logic unit 106 together with the memory cell array ICs or with another integrated circuit (IC) with function including an analog function, a digital signal processing (DSP) function, a communication function, a wireless fidelity (Wi-Fi) function, a power management function, a mix-mode function, an RF function, a micro electro mechanical systems (MEMS) function, or the like.

Because the memory cell array IC 102 or the memory cell array IC 104 have the same laser cutting orientation identification mark, when the memory cell array IC 102 or the memory cell array IC 104 are stacked together, the orientation identification mark can ensure the memory cell array IC 102 and memory cell array IC 104 to get better aligned together. In another embodiment, the orientation identification mark can minimize the cost and alignment efforts required of re-test or a second screening test after having done the initial or screening test for the memory cell array IC 102 or for the logic unit 106. Therefore, the orientation identification marks of the logic unit 106, the memory cell array IC 102 and the memory cell array IC 104 can be applied to a post package assembly process comprising visual inspection, an X-ray inspection, or an Ultrasonic scanning microscope inspection (C-SAM). So, further description thereof is omitted for simplicity.

To sum up, the high speed memory chip module and the electronics system device with the high speed memory chip module provided by the present invention have advantages or utilities as follows: firstly, the present invention has lower power consumption, higher transmission efficiency, lower cost, and higher performance while operating, and can be applied to various ASIC processors (or various SOC processors); and secondly, because the present invention can utilize a plurality of TSVs exist within a non-active circuit region of each memory cell array IC or the plurality of TSVs exist within the non-active circuit region of the logic unit to form a metal fence, thus the present invention has better EMI shielding effect, better heat dissipation capability, and an external noise isolation function based on the magnetic-electronic theory commonly available today. Therefore, compared to the prior art, the present invention has lower power consumption, higher transmission efficiency, lower cost, higher performance, better EMI shielding effect, better heat dissipation capability, and an external noise isolation function, and can be applied to portable electronics system device containing various ASIC processors (or various SOC processors), logic units or memory chip modules.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reconfigurable high speed memory chip module, comprising
   a type of memory cell array group, wherein the type of memory cell array group comprises multiple memory cell array integrated circuits (ICs);
   a first transmission bus coupled to the type of memory cell array group having a first programmable transmitting or receiving data rate, a first programmable transmitting or receiving signal swing;
   a second transmission bus coupled to the logic unit having a second programmable transmitting or receiving data rate, a second programmable transmitting or receiving signal swing; and
   a logic unit coupled to the first transmission bus for accessing the type of memory cell array group through the first transmission bus, and further used for converting a first set of parallel data of the first transmission bus into a second set of parallel data through the second transmission bus.

2. The reconfigurable high speed memory chip module of claim 1, wherein the first transmission bus is used for transmitting the first set of parallel data along with the multiple memory cell array ICs, and bus width of the first transmission bus is wider than bus width of an input/output (I/O) data bus of each of the memory cell array ICs.

3. The reconfigurable high speed memory chip module of claim 1, wherein the second transmission bus has a second programmable data width and a second programmable address width, and the first transmission bus has a first programmable data width and a first programmable address width.

4. The reconfigurable high speed memory chip module of claim 1, wherein programmability of the first transmission bus or the second transmission bus corresponds to a one-time programming (OTP), a multi-time programming (MTP), a Flash Memory, an embedded memory, an anti-fuse, a register, firmware, or software.

5. The reconfigurable high speed memory chip module of claim 1, wherein at least one through silicon via (TSV) exists within a non-active circuit region surrounding or partially surrounding an active circuit region of each of the memory cell array ICs, and the active circuit region is used for forming at least one active device of the memory cell array IC.

6. The reconfigurable high speed memory chip module of claim 1, wherein at least one TSV exists within a non-active circuit region surrounding or partially surrounding an active circuit region of the logic unit, and the active circuit region is used for forming at least one active device of the logic unit, wherein the at least one TSV is used for connecting to a power or a ground supply.

7. The reconfigurable high speed memory chip module of claim 1, wherein at least one pair of TSVs exist in neighboring within a non-active circuit region surrounding or partially surrounding an active circuit region of each of the memory cell array ICs, and wherein the at least one pair of TSVs are used for connecting to a power or a ground supply.

8. The reconfigurable high speed memory chip module of claim 1, wherein at least one pair of TSVs exist in neighboring within a non-active circuit region surrounding or partially surrounding an active circuit region of the logic unit, and wherein the at least one pair of TSVs are used for connecting to a power or a ground supply.

9. The reconfigurable high speed memory chip module of claim 1, wherein a dicing method for at least one memory cell array IC of the multiple memory cell array ICs comprises a laser process.

10. The reconfigurable high speed memory chip module of claim 1, wherein a dicing method for the logic unit comprises a laser process.

11. The reconfigurable high speed memory chip module of claim 3, wherein the first programmable transmitting or receiving data rate, the first programmable transmitting or receiving signal swing, the first programmable data width, and the first programmable address width have first predetermined values, and the second programmable transmitting or receiving data rate, the second programmable transmitting or receiving signal swing, the second programmable data width, and the second programmable address width have second predetermined values.

12. The reconfigurable high speed memory chip module of claim 5, wherein the at least one TSV is used for connecting to a power or a ground supply.

13. The reconfigurable high speed memory chip module of claim 5, wherein the non-active circuit region has a width less than about 50 um.

14. The reconfigurable high speed memory chip module of claim 5, wherein the at least one TSV has a width less than about 20 um.

15. The reconfigurable high speed memory chip module of claim 5, wherein a corner of the memory cell array IC has an orientation identification mark wherein the orientation identification mark is formed by a process comprising Laser step.

16. The reconfigurable high speed memory chip module of claim 5, wherein a corner of the memory cell array IC has an orientation identification mark wherein the orientation identification mark comprises at least one of an edge cut, a line of drawing, two lines of drawing, a hole, or an arbitrary pattern.

17. The reconfigurable high speed memory chip module of claim 6, wherein the logic unit comprises a TSV to connect to a memory cell array IC and further comprises a wire bonding pad to connect to another IC with function being characterized with an analog function, a digital signal processing (DSP) function, a communication function, a wireless fidelity (Wi-Fi) function, a power management function, a mix-mode function, an RF function, or a micro electro mechanical systems (MEMS) function.

18. The reconfigurable high speed memory chip module of claim 6, wherein the non-active circuit region has a width less than about 50 um.

19. The reconfigurable high speed memory chip module of claim 6, wherein the at least one TSV has a width less than about 20 um.

20. The reconfigurable high speed memory chip module of claim 5, wherein a corner of the memory cell array IC has an identification mark wherein the identification mark is formed by a process comprising a TSV step.

21. An electronics device with a reconfigurable high speed memory chip module, the electronics system device comprising:
an application-specific integrated circuit (ASIC) processor;
a type of memory cell array group, wherein the type of memory cell array group comprises multiple memory cell array ICs;
a first transmission bus coupled to the type of memory cell array group having a first programmable transmitting or receiving data rate, a first programmable transmitting or receiving signal swing corresponding to firmware or software comprised in the ASIC processor;
a logic unit coupled to the first transmission bus for accessing the type of memory cell array group through the first transmission bus; and
a second transmission bus coupled between the logic unit and the ASIC processor having a second programmable transmitting or receiving data rate, a second programmable transmitting or receiving signal swing associated to the firmware or the software comprised in the ASIC processor.

22. The electronics system device of claim 21, wherein the second transmission bus has a second programmable data width and a second programmable address width associated to the firmware or the software, and the first transmission bus has a first programmable data width and a first programmable address width associated to the firmware or the software.

23. The electronic device of claim 21, wherein the programmability of the first transmission bus and the second transmission bus are associated with an OTP, an MTP, a Flash Memory, an embedded memory, an anti-fuse memory, a register, the firmware or the software.

* * * * *